(12) United States Patent
Yang et al.

(10) Patent No.: US 9,630,440 B2
(45) Date of Patent: Apr. 25, 2017

(54) STAMP STRUCTURES AND TRANSFER METHODS USING THE SAME

(71) Applicant: Samsung Electronics Co., Ltd., Suwon-Si, Gyeonggi-Do (KR)

(72) Inventors: Ki-yeon Yang, Seongnam-si (JP); Yun-Woo Nam, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/078,763

(22) Filed: Nov. 13, 2013

(65) Prior Publication Data

US 2014/0130691 A1    May 15, 2014

(30) Foreign Application Priority Data

Nov. 14, 2012  (KR) .................. 10-2012-0129103

(51) Int. Cl.
*B41F 27/00* (2006.01)
*B41N 6/00* (2006.01)
*H01L 21/683* (2006.01)

(52) U.S. Cl.
CPC ............ *B41N 6/00* (2013.01); *H01L 21/6838* (2013.01)

(58) Field of Classification Search
CPC ..... H01L 21/76817; H01L 2224/75743; B41L 47/38; B41L 47/02; B41N 6/00
USPC ...................................... 101/382.1
See application file for complete search history.

(56) References Cited

U.S. PATENT DOCUMENTS

| 2009/0203170 A1* | 8/2009 | Nakatani ............... H01L 21/563 438/108 |
| 2010/0123268 A1* | 5/2010 | Menard ........................ 264/293 |
| 2010/0178722 A1* | 7/2010 | de Graff et al. ................ 438/65 |
| 2010/0317132 A1 | 12/2010 | Rogers et al. |
| 2011/0277813 A1 | 11/2011 | Rogers et al. |
| 2012/0027557 A1 | 2/2012 | Ashdown et al. |
| 2014/0216524 A1 | 8/2014 | Rogers et al. |
| 2015/0132873 A1 | 5/2015 | Rogers et al. |

FOREIGN PATENT DOCUMENTS

| DE | 102009000349 A1 * | 7/2010 | ......... H01L 21/6838 |
| EP | 2421035 A2 * | 2/2012 | |
| JP | 2004-325012 | 11/2004 | |
| JP | 2004335012 A | 11/2004 | |
| JP | 2005507562 A | 3/2005 | |
| JP | 2006066767 A * | 3/2006 | |
| KR | 20070019969 A | 2/2007 | |
| KR | 20070037484 A | 4/2007 | |
| KR | 20120033499 A | 4/2012 | |

(Continued)

OTHER PUBLICATIONS

Machine translation of DE 102 009 000 349A1, Sep. 3, 2015.*

(Continued)

*Primary Examiner* — Matthew G Marini
(74) *Attorney, Agent, or Firm* — Harness, Dickey & Pierce, P.L.C.

(57) ABSTRACT

A stamp structure includes a stamp frame having a plate part. The plate part includes a plurality of holes. The plurality of holes are configured to facilitate the adsorption of an object to the plate part during a transfer of the object from a donor substrate to a target substrate.

16 Claims, 12 Drawing Sheets

(56) References Cited

FOREIGN PATENT DOCUMENTS

WO    WO-2010/082993  A3    7/2010
WO    WO-2011/072372  A1    6/2011

OTHER PUBLICATIONS

Kim et al., Kinetically Controlled, Adhesiveless Transfer Printing Using Microstructured Stamps, Applied Physics Letters, 94, 113502 (2009), doi: 10.11063/1.3099052.
Saeidpourazar et al., Laser-Driven Micro Transfer Placement of Prefabricated Microstructures, Journal of Microelectromechanical systems, IEEE, 2012.
Kim et al., Microstructured Elastomeric Surfaces With Reversible Adhesion and Examples of Their Use in Derministic Assembly by Transfer Printing, PNAS, Oct. 2010, vol. 107, No. 40, 17095-17100.
Meitl et al., Transfer Printing by Kinetic Control of Adhesion to an Elastomeric Stamp, Nature Materials, vol. 5, Jan. 2006, pp. 33-38.
Carlson et al., Active, Programmable Elastomeric Surfaces With Tunable Adhesion for Deterministic Assembly by Transfer Printing, Advanced Functional Materials, 2012, doi: 10.1002/adfm.201201023, pp. 1-9.
Kim et al., Enhanced Adhesion With Pedestal-Shaped Elastomeric Stamps for Transfer Printing, Applied Physics Letter, 100, 171909 (2012), doi: 10.1063/1.4706257.
Wolfgang Schwinger, et al. "Fabrication of nano-gold islands with μm spacing using 2.5 dimensional PDMS stamps", Microelectronic Engineering, vol. 85, pp. 1346-1349, (2008).
European Search Report dated Feb. 2, 2016 issued in corresponding European Patent Application No. 13192822.8.

\* cited by examiner

FIG. 14D

STAMP STRUCTURES AND TRANSFER METHODS USING THE SAME

CROSS-REFERENCE TO RELATED APPLICATION

This application claims priority under 35 U.S.C. §119 to Korean Patent Application No. 10-2012-0129103, filed on Nov. 14, 2012 in the Korean Intellectual Property Office, the disclosure of which is incorporated herein in its entirety by reference.

BACKGROUND

1. Field

Some example embodiments relate to stamp structures and/or transfer methods using the same.

2. Description of the Related Art

An interest in transfer technology using a polydimethylsiloxane (PDMS) stamp has recently increased. This technology involves fabricating a single crystalline silicon or Group III-V compound semiconductor microribbon which may be manufactured only on a specific substrate, desorbing the single crystalline silicon or Group III-V compound semiconductor microribbon using a PDMS stamp, and transferring the desorbed single crystalline silicon or Group III-V compound semiconductor microribbon to a target substrate. Such technology allows highly functional ribbons requiring particular process conditions (e.g., relatively high temperature, relatively high pressure, an $H_2$ atmosphere, etc.) as well as a specific substrate (e.g., a silicon-on-insulator (SOI) substrate or a GaAs substrate) to be transferred to various substrates, thus enabling manufacturing of various devices.

An adhesion layer such as UV curable polyurethane has been used to transfer single crystalline ribbons adsorbed on a PDMS stamp to a target substrate, but the adhesive material may frequently cause a process limitation. To this end, research into technology for transferring the PDMS stamp without the adhesion layer has been conducted.

Typical methods for transferring a single crystalline ribbon without the adhesion layer include a method that uses viscoelastic properties of the PDMS stamp. In this method, the ribbon may be transferred to a target substrate by promptly desorbing a single crystalline ribbon from a donor substrate to increase a bonding force between the single crystalline ribbon and the PDMS stamp in the case of desorption, and by slowly desorbing the single crystalline ribbon from the donor substrate to decrease the bonding force between the single crystalline ribbon and the PDMS stamp in the case of transferring. In order to control an adhesive force between the single crystalline ribbon and the PDMS stamp more effectively using this technology, a method of controlling adhesive force by reversibly changing a structure of the PDMS stamp has been developed, and a laser driven transfer printing (LDTP) method of transferring the ribbon by irradiating a pulsed laser to an interface between the single crystalline ribbon and the PDMS stamp, thereby causing a thermal expansion difference therebetween, has also been developed.

However, in the method of transferring without an adhesive layer by using a desorption rate and shape control method of a PDMS stamp, since it is difficult to control the uniform desorption rate and the shape over an entire area of a substrate as the substrate and an apparatus are enlarged, it is difficult to manufacture the substrate in a larger scale, and there is a higher possibility of alignment accuracy being reduced during transferring, according to the change in shape of the PDMS stamp. Additionally, since the LDTP method also uses thermal expansion of PDMS, the alignment accuracy may be further reduced during transferring.

SUMMARY

Some example embodiments relate to stamp structures and transfer methods using the same.

Additional aspects will be set forth in part in the description which follows and, in part, will be apparent from the description, or may be learned by practice of the presented embodiments.

According to an example embodiment, a stamp structure may include a stamp frame including a plate part, the plate part including a plurality of holes, the plurality of holes configured to facilitate the adsorption of an object to the plate part during a transfer of the object from a donor substrate to a target substrate.

The plurality of holes may include at least one of cylindrical holes and slit-shaped holes. The stamp frame may include at least one of PDMS (polydimethylsiloxane), PMMS (poly(methyl-p-methoxyphenylsilylene), PC (polycarbonate), PU (polyurethane), PUA (polyurethane acrylate), glass, quartz, and metal. The stamp frame may include a rigid material.

The stamp structure may further include a membrane on one side of the plate part, the membrane including a material more flexible than the rigid material. The one side may face the object when the object is transferred, and the plurality of holes may pass through the plate part and the membrane. The one side may be patterned to include alternating concave portions and convex portions. The plurality of holes may pass through the convex portions or the concave portions. The one side may be opposite a side facing the object when the object is transferred, and the membrane may cover the plurality of holes.

A bottom surface of the plate part may face the object when the object is transferred, and the bottom surface may be patterned to include alternating concave portions and convex portions. The plurality of holes may pass through the convex portions or the concave portions. The stamp frame may include a rigid material. The stamp structure may further include a membrane on the bottom surface of the plate part, the membrane including a material more flexible than the rigid material.

According to another example embodiment, a transfer method may include preparing a stamp structure, the stamp structure including a stamp frame, the stamp frame having a plate part, the plate part including a plurality of holes; attaching the stamp structure to an object on a donor substrate to separate the object from the donor substrate; and moving the object to a target substrate and separating the stamp structure from the object.

The plurality of holes may include at least one of cylindrical holes and slit-shaped holes. The stamp structure may be attached to the object such that at least one of the plurality of holes corresponds to one object. The stamp structure may also be attached to the object such that at least two holes correspond to one object. The stamp structure may be attached using a vacuum compression method of inhaling air through the plurality of holes. The object may be separated from the stamp structure using an air pressing method of injecting air through the plurality of holes.

The stamp frame may be formed of a rigid material. The stamp structure may further include a membrane on one side of the plate part facing the object, the membrane formed of a material more flexible than the rigid material. The stamp structure may be attached using an intermolecular force between the membrane and the object. The object may be separated from the stamp structure using an air pressing method of injecting air through the plurality of holes.

BRIEF DESCRIPTION OF THE DRAWINGS

The above and/or other aspects of example embodiments will become more apparent and appreciated when the following description is taken in conjunction with the accompanying drawings of which.

DETAILED DESCRIPTION

Reference will now be made in more detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Also, example embodiments described herein are given for illustrative purposes only and various modifications thereof may be made. Furthermore, in a layered structure described herein, the term "upper portion" or "upper" should be understood as including not only one element contacting and directly being on the other element but also one element being above the other element without contacting the other element.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
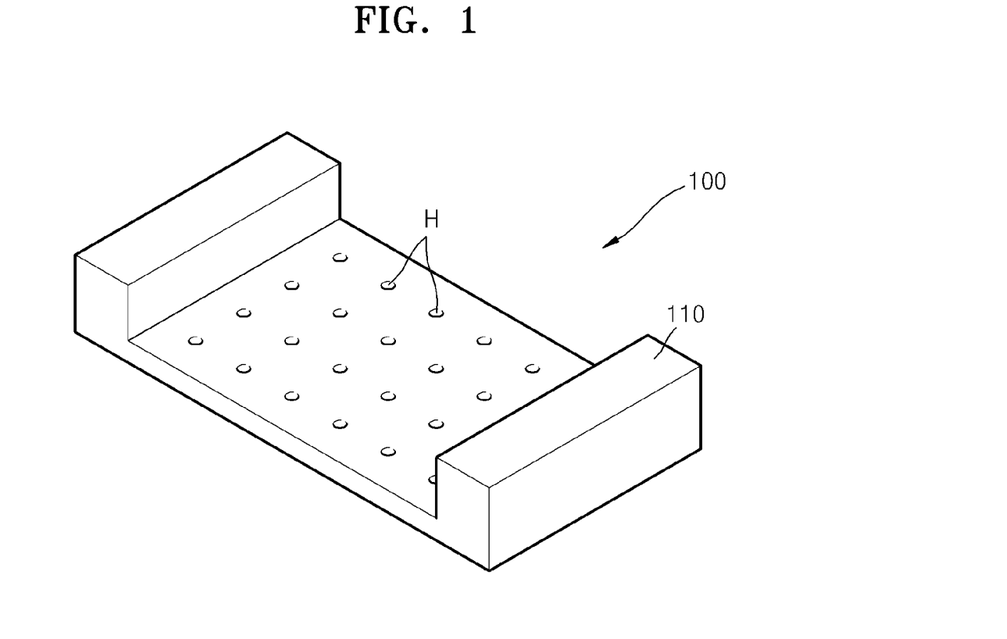
FIG. 1 is a perspective view schematically illustrating a stamp structure according to an example embodiment.

FIG. 1 is a perspective view schematically illustrating a stamp structure 100 according to an example embodiment.

Referring to FIG. 1, the stamp structure 100, which is for transferring an object formed on a donor substrate to a target substrate, includes a stamp frame 110 having a plate part attached to the object, and a plurality of holes H passing through the plate part.

The plurality of holes H are formed so that the object may be pressed tightly to the stamp structure and well separated from the stamp structure, wherein shape, number, and arrangement of the plurality of holes may be determined by considering the form of the object. For instance, the plurality of holes H may include cylindrical holes as illustrated in FIG. 1. However, the plurality of holes H are not limited thereto.

Materials for the stamp frame 110 may include a rigid material as well as flexible materials. For example, polydimethylsiloxane (PDMS), poly(methyl-p-methoxyphenyl-silylene (PMMS), polycarbonate (PC), polyurethane (PU), polyurethane acrylate (PUA), glass, quartz, and metal may be used as the materials for the stamp frame 110.

FIGS. 2A to 2F are views illustrating an example of a transfer method using the stamp structure 100 of FIG. 1.

Figure 2A:
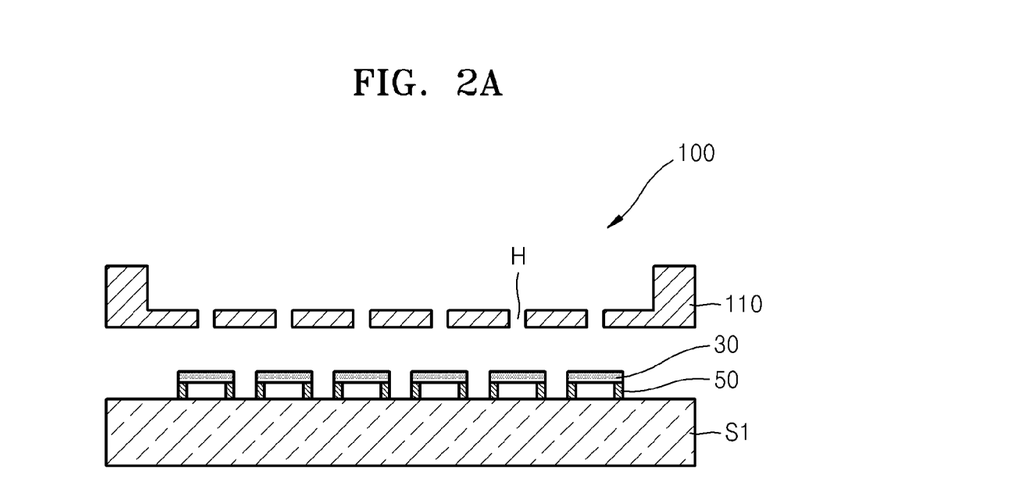
FIGS. 2A to 2F are views illustrating an example of a transfer method using the stamp structure of FIG. 1.

As illustrated in FIG. 2A, the stamp structure 100 is arranged such that the plurality of holes H respectively face a plurality of objects 30 formed on a donor substrate 51.

The object 30 may be raised above the donor substrate 51 by bridges 50. The object 30 may be prepared in the manner illustrated in FIG. 2A so that it is well separated from the donor substrate 51, or may be prepared to have a "T" shaped structure so that one bridge supports one object.

Figure 2B:
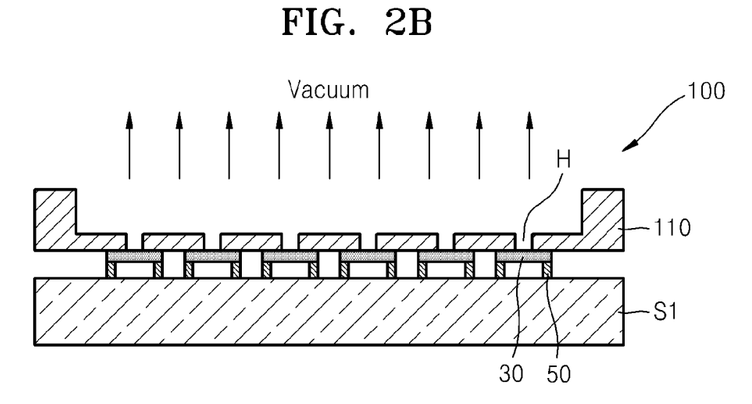

As illustrated in FIG. 2B, the stamp structure 100 is arranged on the object 30, and air is inhaled through the plurality of holes H to vacuum press the object 30 to the stamp structure 100.

Figure 2C:
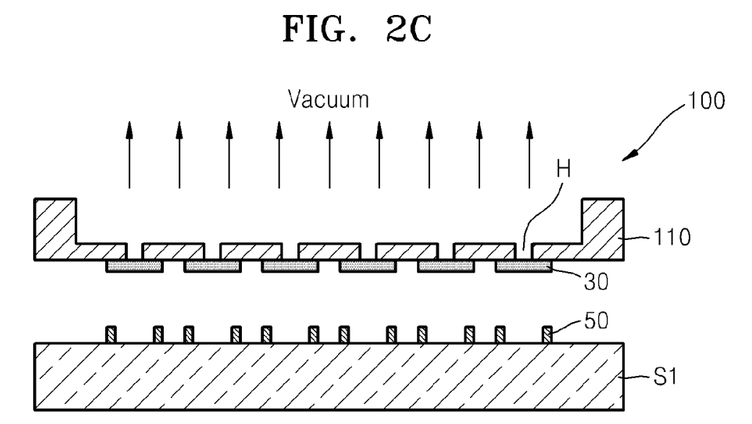

When the stamp structure 100 is lifted as illustrated in FIG. 2C, the object 30 is desorbed from the bridges 50 and separated from the donor substrate S1 due to the object 30 being adsorbed/pressed to the stamp structure 100.

Figure 2D:
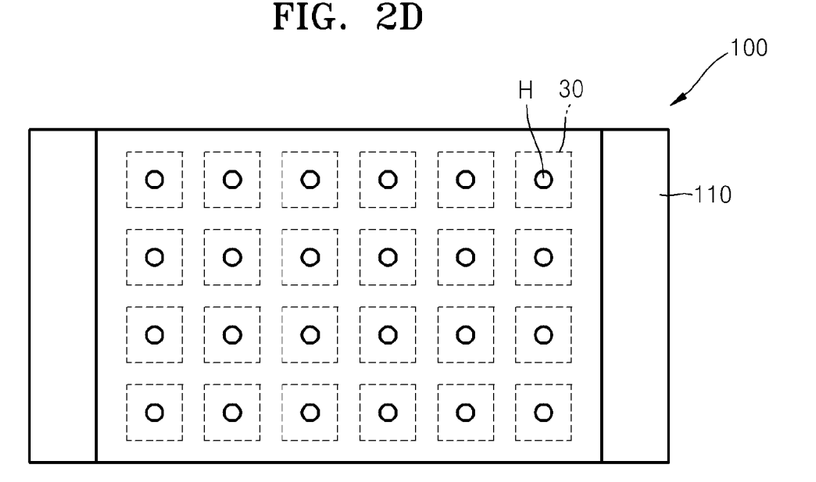

FIG. 2D is a plan view of the object 30 attached to the stamp structure 100 as illustrated in FIG. 2C, and illustrates the correspondence relationship between the object 30 and the holes H. As illustrated in FIG. 2D, the object 30 is attached to the stamp structure 100 in such a manner that one hole H corresponds to one object 30.

Figure 2E:
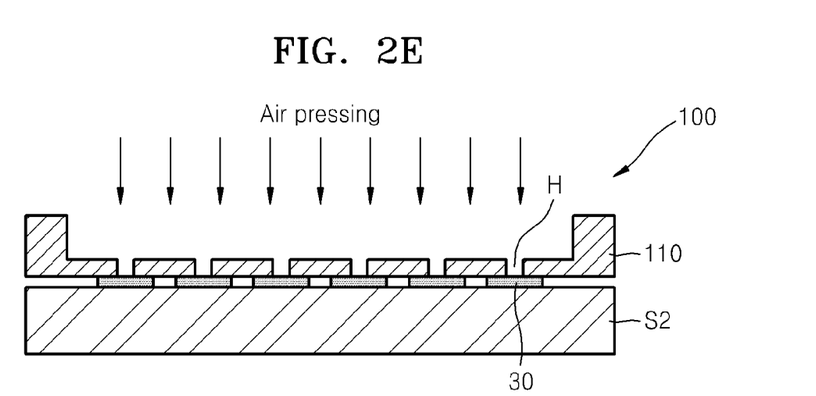

Thereafter, as illustrated in FIG. 2E, the object 30 is attached to the target substrate S2 by an air pressing method of injecting air through the plurality of holes H after the stamp structure 100 to which the object 30 is attached is placed on the target substrate S2.

Figure 2F:
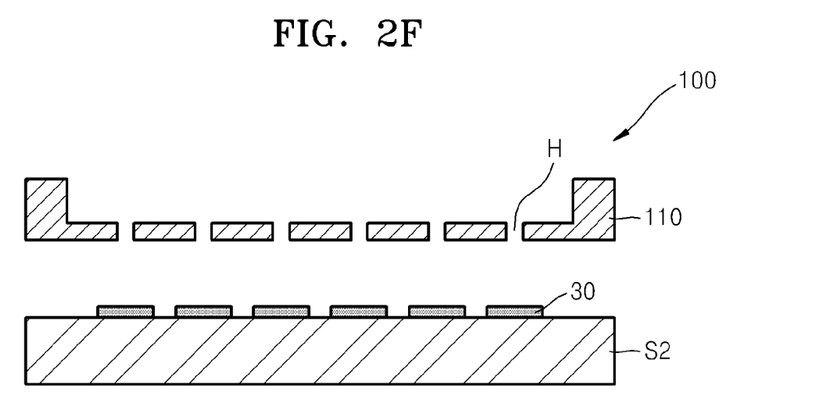

As illustrated in FIG. 2F, the stamp structure 100 is separated from the object 30 to complete transfer of the object 30 to the target substrate S2.

A transfer method using the stamp structure 100 according to the present embodiment separates the object 30 from the donor substrate S1 and attaches the object 30 to the target substrate S2 by a method of air inhalation and air injection with respect to a plurality of holes H formed in the stamp structure 100. Alignment accuracy of the object 30 is improved when the object 30 formed on a relatively large area is transferred since it is possible to transfer the object 30 by a relatively simple process, and since the stamp structure 100 is formed of a rigid material, the stamp structure 100 is not modified during transferring.

Hereinafter, stamp structures and transfer methods of various embodiments are described.

Figure 3A:
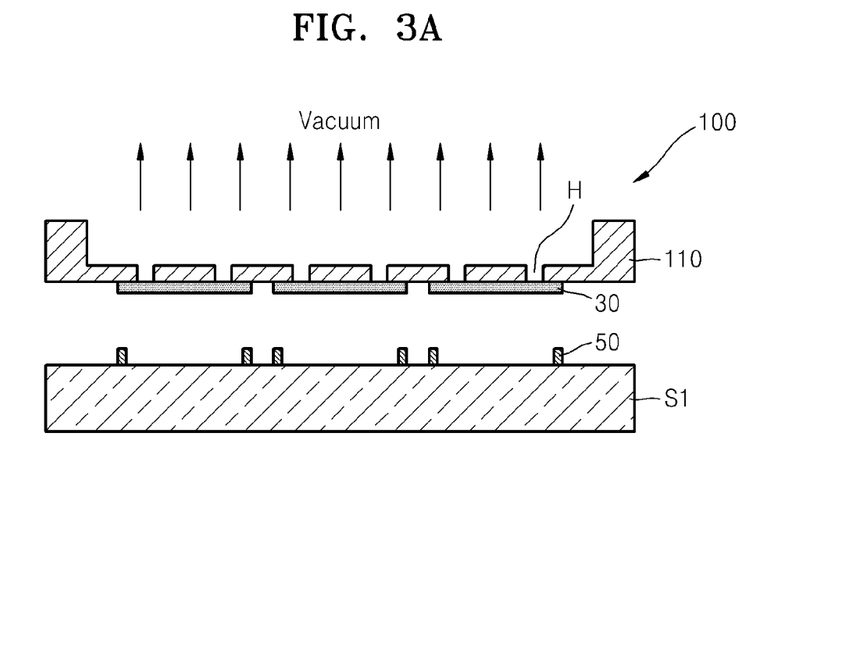
FIGS. 3A and 3B are views illustrating another example of a transfer method using the stamp structure of FIG. 1.
Figure 3B:
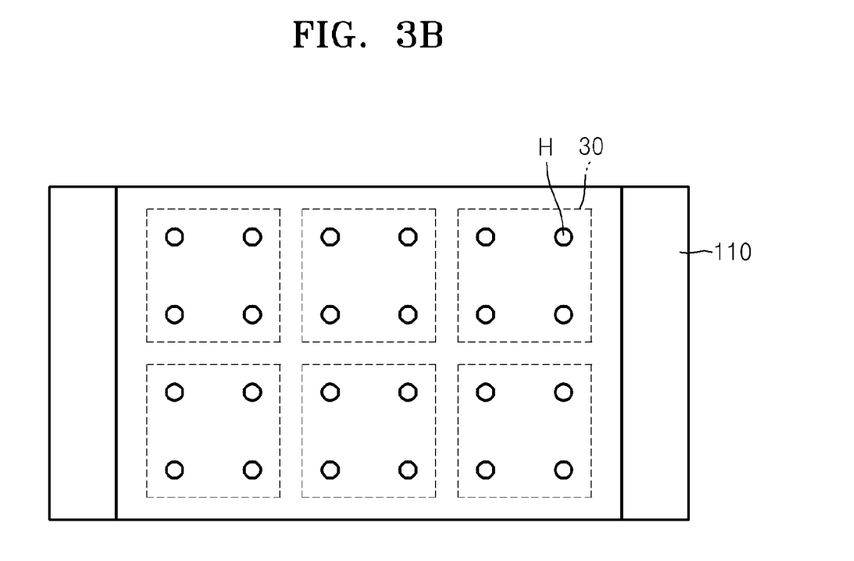

FIGS. 3A and 3B are views illustrating another example of a transfer method using the stamp structure 100 of FIG. 1.

Referring to FIG. 3A, a transfer method of the present embodiment is different from the transfer methods described in FIGS. 2A to 2F in that two or more holes correspond to one object 30 when the object 30 is adsorbed/attached to the stamp structure 100. For instance, an appropriate number of holes H correspond to one object 30 according to the size of the object 30 such that the object 30 is attached to the stamp structure 100 with a uniform compression force.

It is illustrated in FIG. 3B that four holes H correspond to one object 30. However, this is just an example and is not limited thereto. For instance, the stamp structure 100 may be configured such that three or less (or five or more) holes H correspond to one object 30.

Figure 4A:
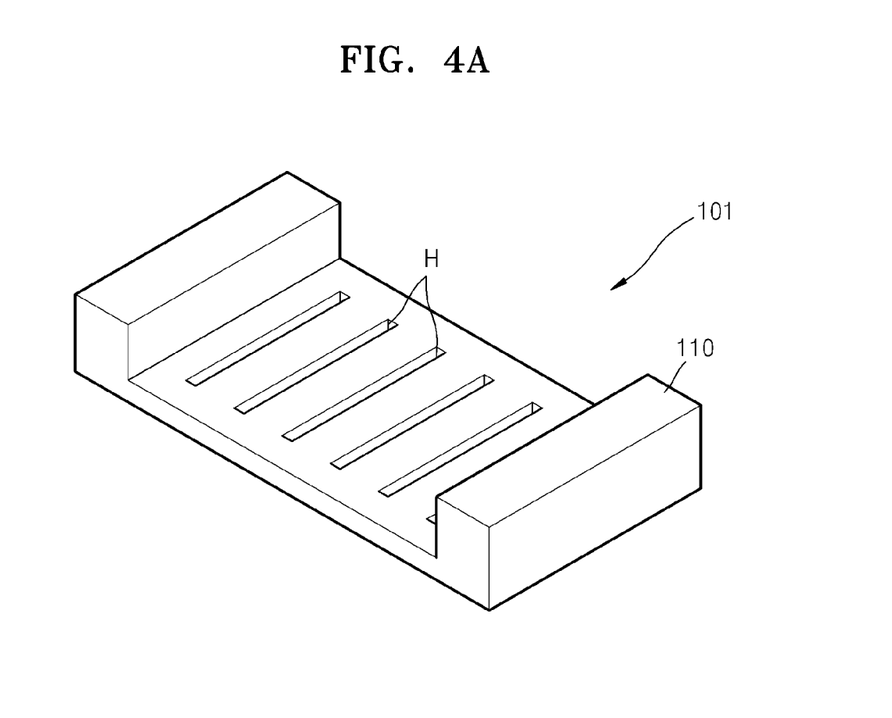
FIGS. 4A to 4C are perspective views schematically illustrating a stamp structure according to another example embodiment and a transfer method using the stamp structure.
Figure 4B:
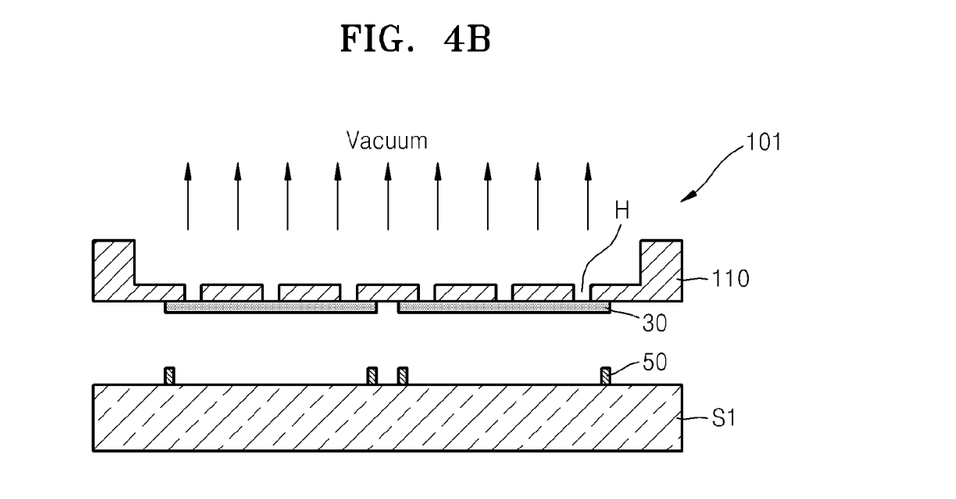
Figure 4C:
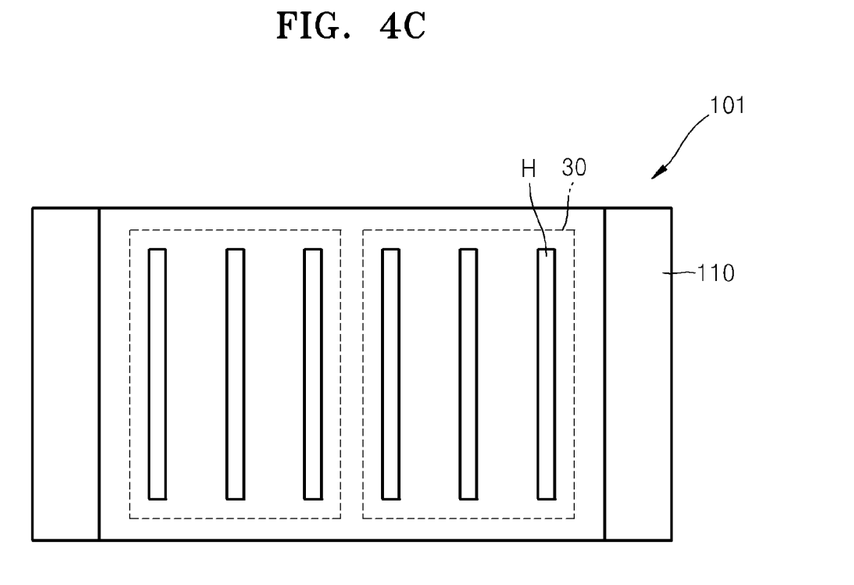

FIGS. 4A to 4C are perspective views schematically illustrating a stamp structure 101 according to another example embodiment, and illustrate a transfer method using the stamp structure.

Referring to FIG. 4A, holes H formed in the stamp structure 101 are formed as slits.

As illustrated in FIGS. 4B and 4C, the object 30 may be attached to the stamp structure 101 in such a way that one object 30 corresponds to three slit-shaped holes H. However, the present embodiment is not limited thereto.

Figure 5A:
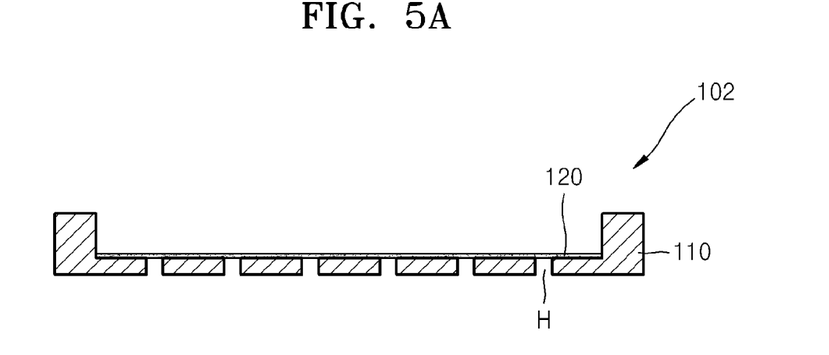
FIGS. 5A to 5C are views schematically illustrating a stamp structure according to another example embodiment and a transfer method using the stamp structure.
Figure 5B:
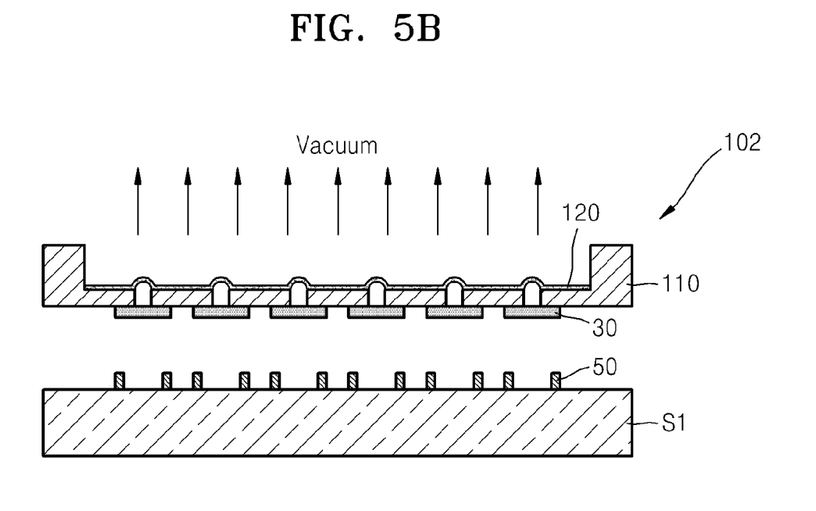
Figure 5C:
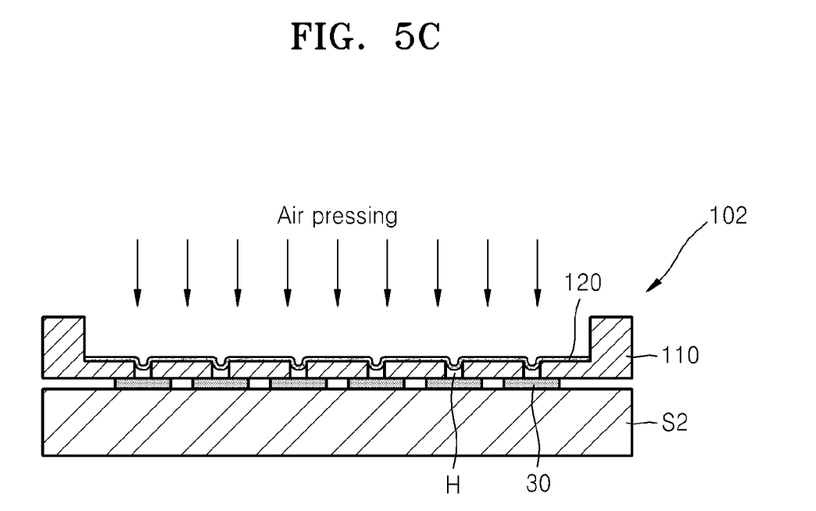

FIGS. 5A to 5C are views schematically illustrating a stamp structure 102 according to another embodiment, and illustrate a transfer method using the stamp structure.

Referring to FIG. 5A, the stamp structure 102 includes a stamp frame 110 having a plate part, a plurality of holes H passing through the plate part, and a flexible membrane 120 formed on one side of the plate part. The stamp frame 110 may be formed of rigid material, and the membrane 120 may be formed of a material that is more flexible than the stamp frame 110. The membrane 120 may be formed of a polymer material that has flexible properties. A plurality of holes H may be formed to have a cylindrical shape as illustrated in FIG. 1, or may be formed as slits as illustrated in FIG. 4A. However, the present disclosure is not limited to the examples illustrated in these drawings.

As illustrated in FIG. 5B, the membrane 120 may be formed to have a shape such that the membrane covers a plurality of holes H on the opposite side to a side of a stamp structure 102 to which an object 30 is attached during a transfer of the object 30. Since the membrane 120 has flexible properties, the membrane 120 is deformed in a convex shape in the upward direction or in the downward direction as illustrated in FIGS. 5B and 5C, and thus allows the object 30 to be vacuum-pressed to the stamp structure 102 or allows the object 30 to be separated from the stamp structure 102 by air pressing.

The above-mentioned structure has an effect that each of the plurality of holes H is isolated by the membrane 120. In the case of not having the membrane 120, when the to-be-transferred bodies 30 are picked up, some of the to-be-transferred bodies 30 may not be picked up. In this case, vacuum is broken at the corresponding holes, and thus leakage occurs and an inhalation force applied to the to-be-transferred bodies 30 may be weakened accordingly. However, in the case of the present embodiment, since the inhalation force of each of the plurality of holes H is independently formed by the membrane 120, picking up of the remaining to-be-transferred bodies 30 is not influenced even if some of the to-be-transferred bodies 30 are not picked up.

While the above-described embodiment describes the transfer method in which one object 30 corresponds to one of the holes H, this is only an example and a transfer method in which one pattern of the object 30 corresponds to two or more holes H may be also possible as illustrated in FIGS. 3A and 3B.

Figure 6:
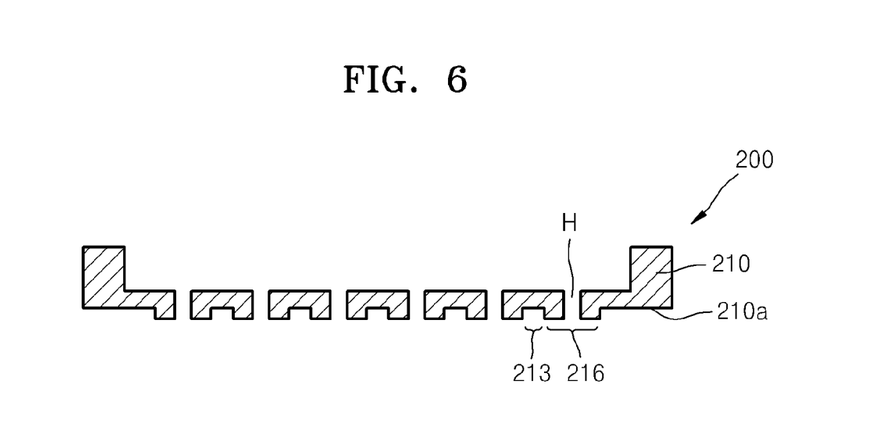
FIG. 6 is a cross-sectional view schematically illustrating a stamp structure according to another example embodiment.

FIG. 6 is a cross-sectional view schematically illustrating a stamp structure 200 according to another example embodiment.

The stamp structure 200 of the present embodiment is patterned in such a shape that the bottom 210a of a stamp frame 210 has concave portions 213 and convex portions 216. A plurality of holes H are formed in such a manner that the holes H pass through the convex portions 216. Such a structure enables the object 30 to be attached to the convex portions 216, and facilitates adjustment of an alignment degree during transferring of the object 30. Although FIG. 6 illustrates that one of the holes H is formed in the convex portions 216, this is only an example, and the convex portions 216 may be modified in such a manner that a plurality of holes H are formed in the convex portions 216.

Figure 7:
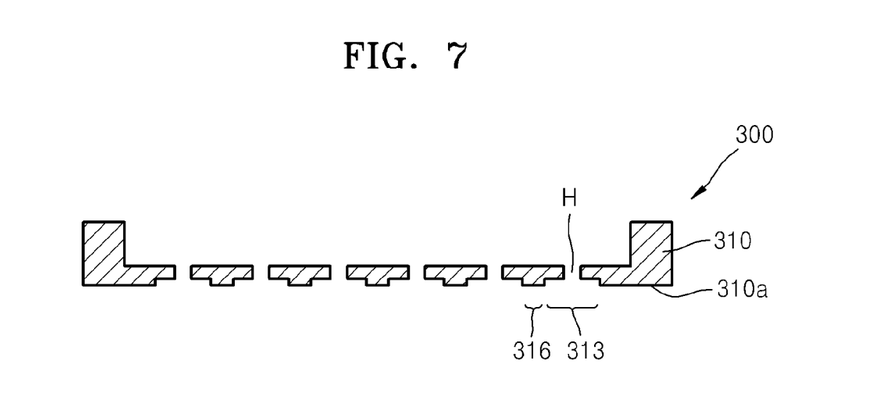
FIG. 7 is a cross-sectional view schematically illustrating a stamp structure according to another example embodiment.

FIG. 7 is a cross-sectional view schematically illustrating a stamp structure according to another example embodiment.

A stamp structure 300 of the present embodiment is patterned in such a shape that the bottom 310a of a stamp frame 310 has concave portions 313 and convex portions 316. A plurality of holes H are formed in such a manner that the holes H pass through the concave portions 313. This structure enables the object 30 to be attached to the concave portions 313, and facilitates adjustment of an alignment degree during transferring of the object 30 as in the embodiment of FIG. 6. Although FIG. 7 illustrates that one of the holes H is formed in the concave portions 313, this is only an example, and the concave portions 313 may be deformed in such a manner that a plurality of holes H are formed in the concave portions 313.

Figure 8:
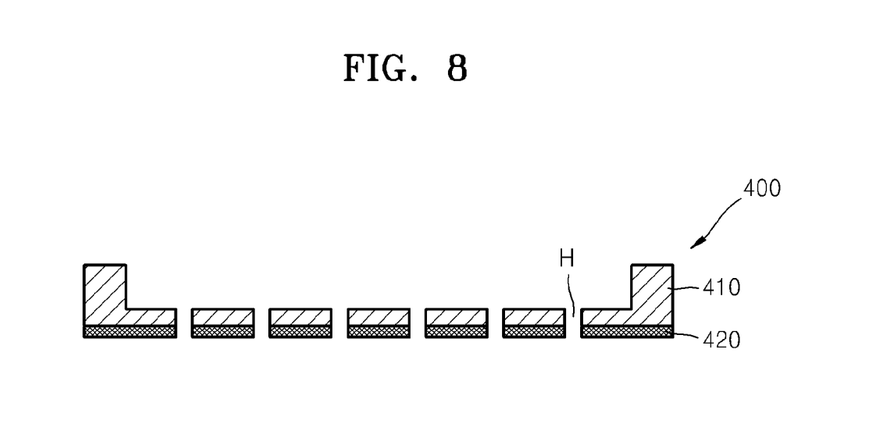
FIG. 8 is a cross-sectional view schematically illustrating a stamp structure according to another example embodiment.

FIG. 8 is a cross-sectional view schematically illustrating a stamp structure 400 according to another example embodiment.

The stamp structure 400 includes a stamp frame 410 having a plate part, and a membrane 420 formed on the bottom of the stamp frame 410. A plurality of holes H are formed in such a manner that the holes pass through the plate part and the membrane 420. The stamp frame 410 may be formed of a rigid material, and the membrane 420 may be formed of a material that is more flexible than the stamp frame 410. The stamp structure 400 of such a structure enables pressing of an object by using viscoelastic properties of the membrane 420. Namely, since intermolecular force, Van der Waals force between the membrane 420 and the object 30 can be used in the stamp structure 400, the vacuum inhalation process may be omitted.

Hereinafter, as in the embodiment of FIG. 8, examples of the stamp structure constructed in such a manner that the vacuum inhalation process may be omitted during pressing of the object will be explained.

Figure 9:
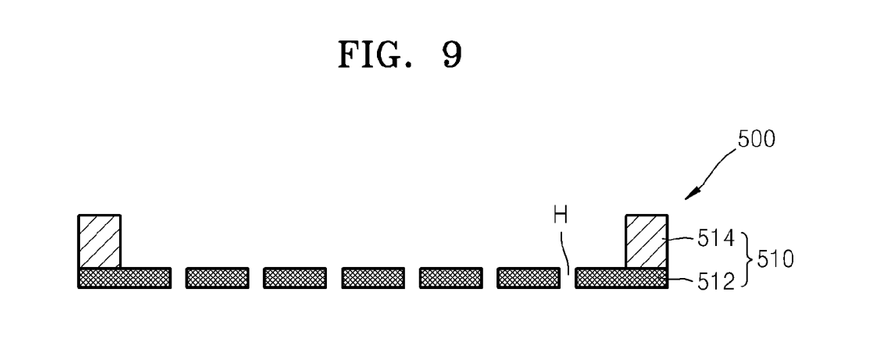
FIG. 9 is a cross-sectional view schematically illustrating a stamp structure according to another example embodiment.

FIG. 9 is a cross-sectional view schematically illustrating a stamp structure 500 according to another example embodiment.

The stamp structure 500 of the present embodiment has a plate part 512 which is entirely formed of a flexible polymer material. That is, a stamp frame 510 may include a frame part 514 formed of a rigid material and a plate part 512 formed of a flexible material, and a plurality of holes H are formed in such a way that the holes pass through the plate part 512.

Figure 10:
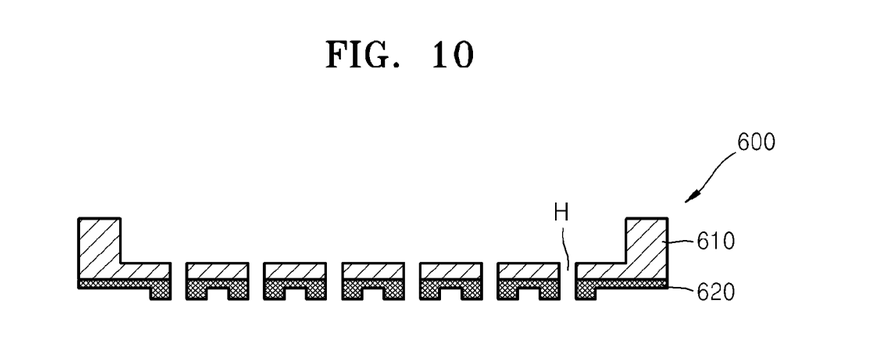
FIG. 10 is a cross-sectional view schematically illustrating a stamp structure according to another example embodiment.

FIG. 10 is a cross-sectional view schematically illustrating a stamp structure 600 according to another example embodiment.

The stamp structure 600 includes a stamp frame 610 having a plate part and a membrane 620 formed on the bottom of the stamp frame 610. The bottom of the membrane 620 facing an object when the object is transferred is patterned to have a shape in which concave portions and convex portions are alternated. A plurality of holes H are formed in such a manner that the plurality of holes H pass through both the plate part and the membrane 620. For instance, the plurality of holes H may be formed in positions where the holes H pass through the convex portions as illustrated in FIG. 10.

Figure 11:
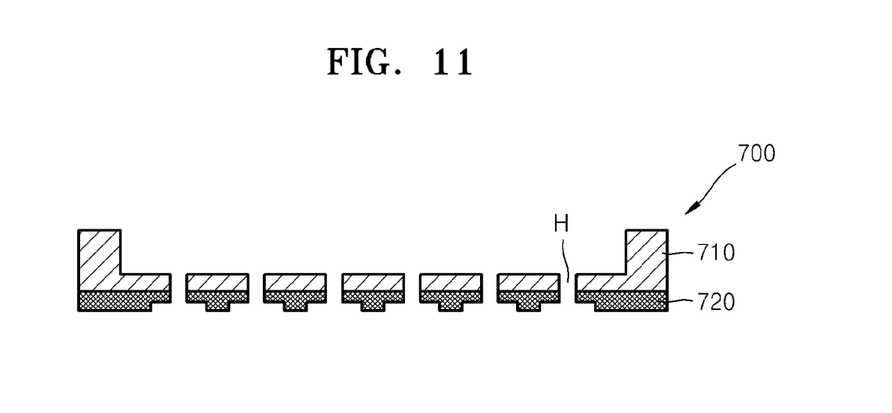
FIG. 11 is a cross-sectional view schematically illustrating a stamp structure according to another example embodiment.

FIG. 11 is a cross-sectional view schematically illustrating a stamp structure 700 according to another example embodiment.

The stamp structure 700 includes a stamp frame 710 having a plate part and a membrane 720 formed on the bottom of the stamp frame 710. The bottom of the membrane 720 facing an object when the object is transferred, is patterned to have a shape in which concave portions and convex portions are alternated. A plurality of holes H are formed in such a manner that the plurality of holes H pass through the plate part and the membrane 720. For instance, the plurality of holes H may be formed in positions where the holes H pass through the concave portions as illustrated in FIG. 11.

Figure 12:
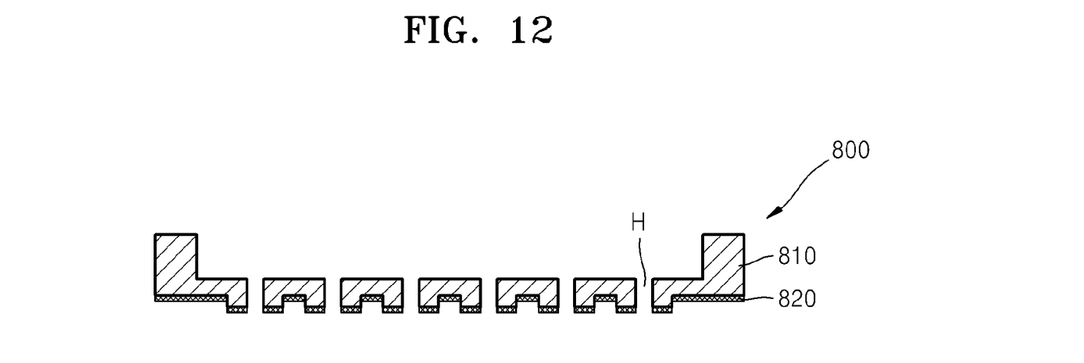
FIG. 12 is a cross-sectional view schematically illustrating a stamp structure according to another example embodiment.

FIG. 12 is a cross-sectional view schematically illustrating a stamp structure 800 according to another example embodiment.

The stamp structure 800 of the present embodiment includes a stamp frame 810 which has a plurality of holes H, and of which the bottom is patterned to have a shape in which concave portions and convex portions are alternated and a membrane 820 formed on the bottom of the stamp frame 810.

The stamp structure 800 of the present embodiment is the same as a structure in which a membrane is formed on the bottom of the stamp structure 200 of FIG. 6, or may be modified into a structure in which a membrane is formed on the bottom of the stamp structure 300 of FIG. 7, which is different from the structure of FIG. 6.

Figure 13A:
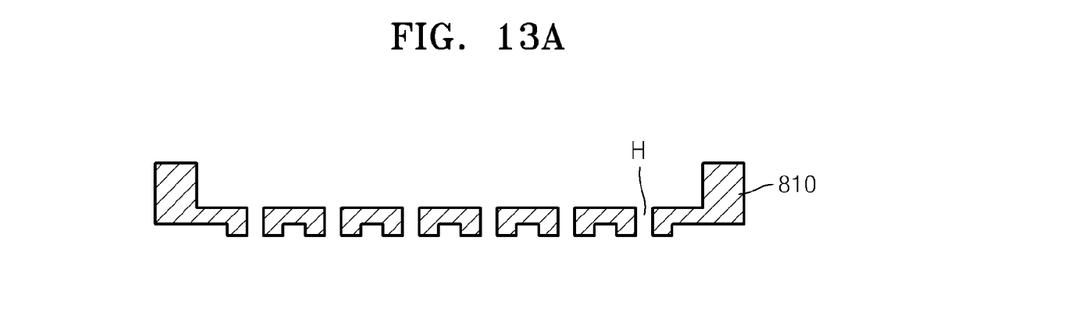
FIGS. 13A to 13C are views schematically illustrating a method of manufacturing the stamp structure of FIGS. 12.
Figure 13B:
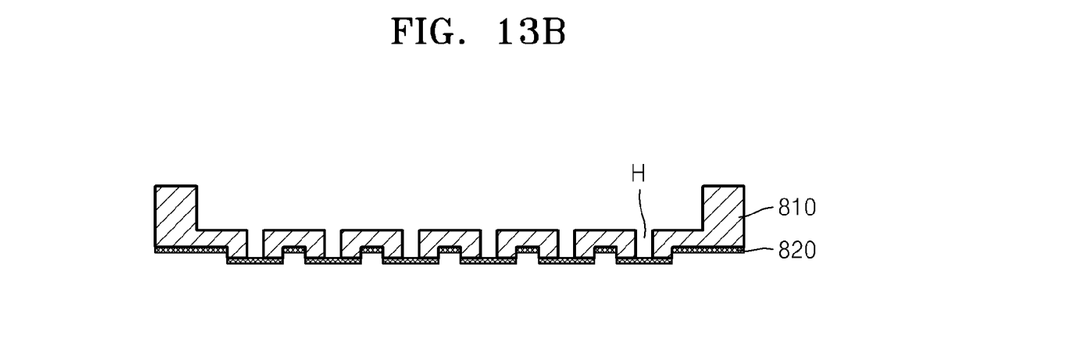
Figure 13C:
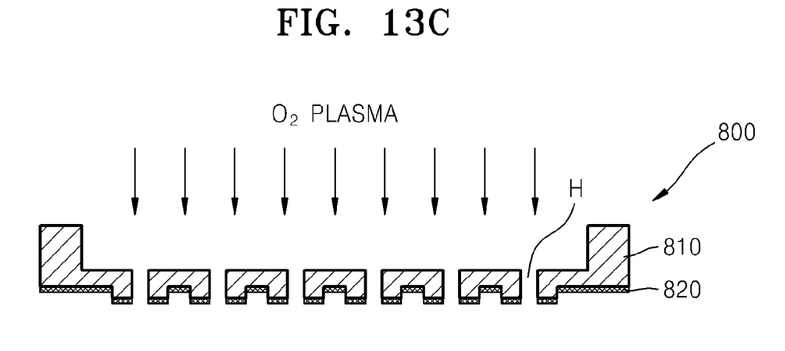

FIGS. 13A to 13C are views schematically illustrating a method of manufacturing the stamp structure 800 of FIG. 12.

As illustrated in FIG. 13A, the stamp frame 810, which has a plurality of holes H, and on the bottom of which concave portions and convex portions are patterned in such a shape that the concave portions and the convex portions are alternated, is formed. The stamp frame 810 may be formed of a rigid material such as glass, quartz, and metal.

The stamp structure 800 is formed by forming a membrane 820 on the bottom of the stamp frame 810 as illustrated in FIG. 13B, and performing an oxygen plasma process, thereby extending the holes H in such a way that holes H formed in the stamp frame 810 pass through the membrane 820 as illustrated in FIG. 13C.

FIGS. 14A to 14D are views illustrating a transfer method using the stamp structure 800 of FIG. 12.

Figure 14A:
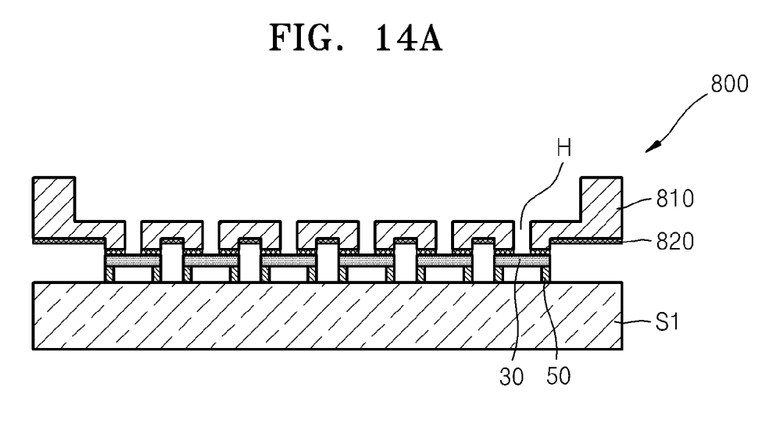
FIGS. 14A to 14D are views describing a transfer method using the stamp structure of FIG. 12.
Figure 14B:
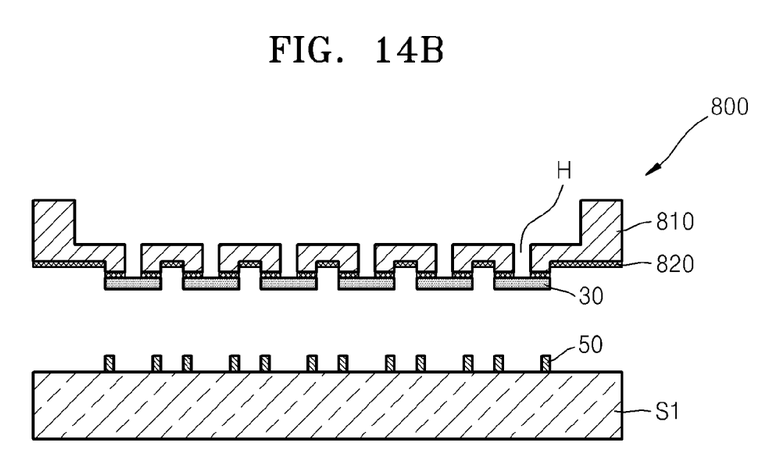

As illustrated in FIGS. 14A and 14B, when the object 30 formed on the donor substrate 51 is pressed to the stamp structure 800, the object 30 is adhered to the bottom of the stamp structure 800 by intermolecular force between the membrane 820 and the object 30. Accordingly, the object 30 may be desorbed from the bridges 50 without using the vacuum inhalation process such that the object 30 is separated from the donor substrate S1.

Figure 14C:
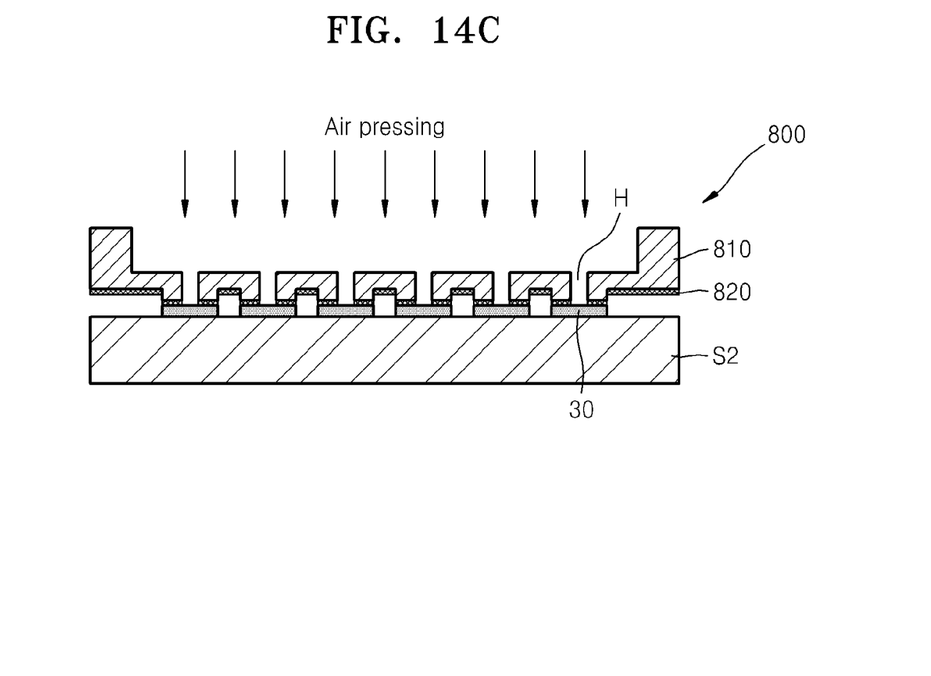
Figure 14D:
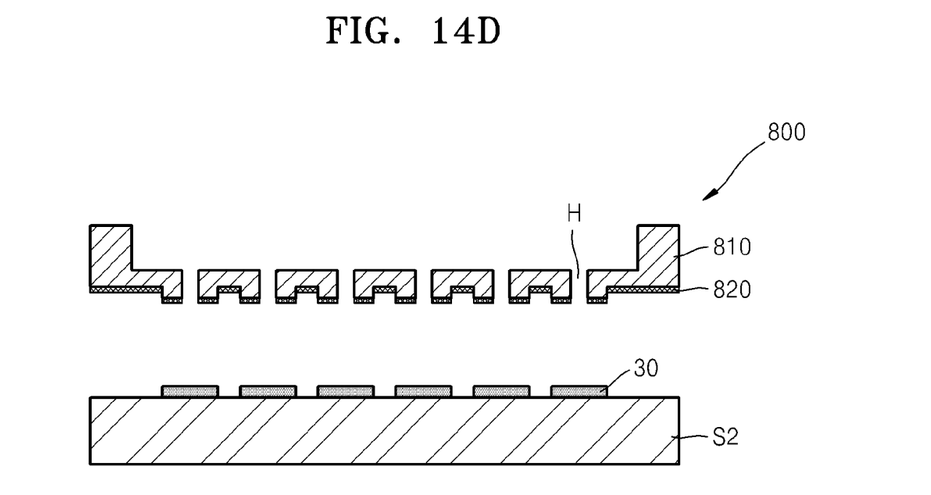

The object 30 pressed to the stamp structure 800 is separated from the stamp structure 800 such that the object 30 may be adhered to the target substrate S2 by an air pressing method of injecting air through the plurality of holes H when the object 30 is transferred to the target substrate S2 as illustrated in FIG. 14C and FIG. 14D.

While the transfer method illustrated in FIGS. 14A to 14D has been described in regard to the stamp structure 800 of FIG. 12, the same transfer method may be used even when the stamp structures 400, 500, 600 and 700 of FIGS. 8 to 11 including polymer membranes having viscoelastic properties are used.

Furthermore, while the transfer method in which one object 30 corresponds to one of the holes H is described in the descriptions of FIGS. 14A to 14C, this is merely an example and may be changed to a transfer method in which one object 30 corresponds to two or more holes H. For instance, the stamp structure 800 may be changed to have a shape in which two or more holes H are formed in the convex portions in order to change the transfer method.

The above-mentioned stamp structure includes a stamp frame having a plate part to be attached to the object, and a plurality of holes passing through the plate part, and thus may transfer the object to the target substrate by separating the object from the donor substrate without using the adhesive layer.

Since the transfer methods using the above-mentioned stamp structure include pressing/adsorbing the object using vacuum inhalation and/or intermolecular interactions and transferring the object to the target substrate using desorption by air pressing, the stamp frame may be formed from a rigid material such that the stamp frame is not deformed during transferring. Accordingly, even when a plurality of to-be-transferred bodies are transferred to the target substrate, alignment accuracy is relatively high.

Highly functional devices in various fields such as high performance flexible devices may be manufactured by transferring various functional materials, such as single crystalline Si, Group III-V compound semiconductor, that may be prepared on particular substrates to desired (or predetermined) substrates according to the above-mentioned stamp structures and transfer methods using the stamp structures.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A stamp structure comprising:
a stamp frame having a plate part and a membrane on one side of the plate part, the stamp frame including a plurality of holes passing through the plate part, the plate part including a rigid material, and the membrane including a material more flexible than the rigid material,
wherein the plurality of holes are configured to facilitate the adsorption of an object to directly contact one of the plate part and the membrane during a transfer of the object from a donor substrate to a target substrate,
wherein the plate part has a first and second surface, the first surface facing the object during the transfer of the object and the second surface opposite the first surface, and
wherein the membrane contacts one of the first and second surfaces, the plurality of holes passing through the plate part and the membrane when the membrane contacts the first surface.

2. The stamp structure of claim 1, wherein the plurality of holes include cylindrical holes or slit-shaped holes.

3. The stamp structure of claim 1, wherein the stamp frame includes one of PMMS (poly(methyl-p-methoxyphenylsilylene), PC (polycarbonate), PU (polyurethane), PUA (polyurethane acrylate), glass, quartz, and metal.

4. The stamp structure of claim 1, wherein the first surface includes alternating concave portions and convex portions.

5. The stamp structure of claim 1, wherein the membrane contacts the second surface and covers the plurality of holes.

6. The stamp structure of claim 1, wherein a bottom of the plate part is configured to face the object during the transfer of the object, the bottom of the plate part including alternating concave portions and convex portions.

7. The stamp structure of claim 1, wherein the stamp frame and the plate part form an integral structure.

8. A transfer method comprising:
preparing a stamp structure, the stamp structure including a stamp frame, the stamp frame having a plate part and a membrane on one side of the plate part, the stamp frame including a plurality of holes passing through the plate part, the plate part including a rigid material and the membrane including a material more flexible than the rigid material;
attaching the stamp structure to a plurality of objects on a donor substrate to separate the plurality of objects from the donor substrate, the stamp structure directly contacting the plurality of objects and each of the plurality of objects being adsorbed to at least one of the plurality of holes; and
moving the plurality of objects simultaneously to a target substrate and separating the stamp structure from the plurality of objects,
wherein the plate part has a first and second surface, the first surface facing the plurality of objects and the second surface opposite the first surface, and
wherein the membrane contacts one of the first and second surfaces, the plurality of holes passing through the plate part and the membrane when the membrane contacts the first surface.

9. The transfer method of claim 8, wherein the preparing includes forming the plurality of holes to include at least one of cylindrical holes and slit-shaped holes.

10. The transfer method of claim 8, wherein the attaching includes aligning the stamp structure with the plurality of objects such that at least one of the plurality of holes corresponds to a respective one of the plurality of objects.

11. The transfer method of claim 8, wherein the attaching includes aligning the stamp structure with the plurality of objects such that at least two of the plurality of holes correspond to a respective one of the plurality of objects.

12. The transfer method of claim 8, wherein the attaching includes a vacuum compression method of inhaling air through the plurality of holes.

13. The transfer method of claim 8, wherein the separating the stamp structure from the plurality of objects includes an air pressing method of injecting air through the plurality of holes.

14. The transfer method of claim 8, wherein the attaching includes an intermolecular force between the membrane and the plurality of objects.

15. The transfer method of claim 14, wherein the separating the stamp structure from the plurality of objects includes an air pressing method of injecting air through the plurality of holes.

16. The transfer method of claim 8, wherein the preparing prepares the stamp frame and the plate part as an integral structure.

* * * * *